US009652916B2

(12) United States Patent
Fontanet et al.

(10) Patent No.: US 9,652,916 B2
(45) Date of Patent: May 16, 2017

(54) DEVICE FOR DETECTING THE PRESENCE OF A USER, AND VEHICLE DOOR HANDLE COMPRISING SAID DEVICE

(71) Applicants: Alain Fontanet, Muret (FR); Xavier Hourne, Cugnaux (FR); Cyril Robin, Villeneuve Tolosane (FR)

(72) Inventors: Alain Fontanet, Muret (FR); Xavier Hourne, Cugnaux (FR); Cyril Robin, Villeneuve Tolosane (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 343 days.

(21) Appl. No.: 14/458,638

(22) Filed: Aug. 13, 2014

(65) Prior Publication Data
US 2015/0054617 A1 Feb. 26, 2015

(30) Foreign Application Priority Data

Aug. 22, 2013 (FR) ..................................... 13 58116

(51) Int. Cl.
*G07C 9/00* (2006.01)
*H03K 17/96* (2006.01)
(Continued)

(52) U.S. Cl.
CPC ....... *G07C 9/00182* (2013.01); *H03K 17/962* (2013.01); *B60R 25/24* (2013.01);
(Continued)

(58) Field of Classification Search
CPC ........ G07C 9/00182; G07C 2009/0019; H03K 17/962; H03K 2017/9602;
(Continued)

(56) References Cited

U.S. PATENT DOCUMENTS

2003/0128116 A1* 7/2003 Ieda ........................ E05B 81/78
340/562
2005/0270039 A1 12/2005 Mackey
(Continued)

FOREIGN PATENT DOCUMENTS

DE 102006025075 A1 12/2007

OTHER PUBLICATIONS

FR Search Report, dated May 8, 2014, from corresponding FR application.

*Primary Examiner* — James Yang
(74) *Attorney, Agent, or Firm* — Young & Thompson

(57) ABSTRACT

A device (D') for detecting the presence of a user includes: an electrode (12'), electrode control elements (13), and a low frequency antenna (11). The electrode (12') is formed by a plurality of structural units ($M_A \ldots M_I$), each structural unit ($M_A \ldots M_I$) including: a conductive segment (A ... I) defined by dimensions (Lx, lx, $e_x$) and electrically connected at least to a conductive connection ($C_{XY}$) defined by a position of connection with respect to the conductive segment (A ... I). The structural units ($M_A \ldots M_I$) are electrically interconnected by the conductive connections ($C_{XY}$). At least two consecutive structural units ($M_A \ldots M_I$) differ by: the dimensions (Lx, lx, $e_x$) of the conductive segment (A ... I) and/or the position of the conductive connection ($C_{XY}$).

6 Claims, 4 Drawing Sheets

Figure 1:
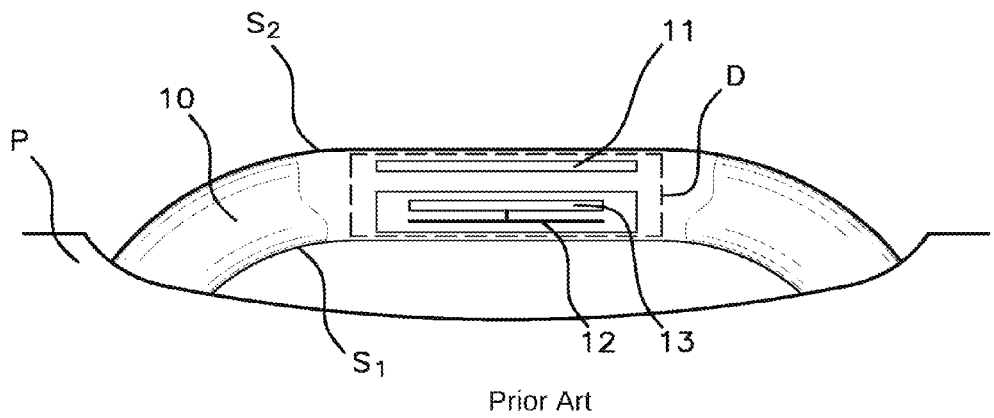

(51) Int. Cl.
  *B60R 25/24* (2013.01)
  *G01D 5/24* (2006.01)
(52) U.S. Cl.
  CPC ... *G01D 5/2405* (2013.01); *G07C 2009/0019* (2013.01); *H03K 2017/9602* (2013.01); *H03K 2217/96078* (2013.01); *H03K 2217/960705* (2013.01)
(58) Field of Classification Search
  CPC ........ H03K 2217/960705; H03K 2217/96078; B60R 25/24; G01D 5/2405
  See application file for complete search history.

(56) References Cited

U.S. PATENT DOCUMENTS

| | | | |
|---|---|---|---|
| 2007/0008235 A1* | 1/2007 | Tsukahara | B60R 25/246 343/788 |
| 2011/0001549 A1* | 1/2011 | Van Gastel | H03K 17/955 327/517 |
| 2013/0154991 A1 | 6/2013 | Yilmaz | |

* cited by examiner

DEVICE FOR DETECTING THE PRESENCE OF A USER, AND VEHICLE DOOR HANDLE COMPRISING SAID DEVICE

FIELD OF THE INVENTION

The invention relates to a device for detecting the presence of a user, and to a vehicle door handle comprising said device.

BACKGROUND OF THE INVENTION

Nowadays, vehicle door handles are equipped with devices for detecting the presence of a user. The detection of the presence of a user coupled with the "hands-free" recognition of an electronic badge for remote access control, said badge being carried by this user, enables the remote locking and unlocking of the openings of the vehicle. Thus, when the user, who is carrying the corresponding electronic badge, which has also been identified by the vehicle, wishes to unlock the vehicle, he approaches or touches the door handle of the vehicle. The openings of the vehicle are then unlocked automatically. By approaching or pressing on a specific part of the door handle of the vehicle, referred to as the "unlocking zone", the door (or alternatively all the openings) is (are) unlocked without further action on the part of the user. Conversely, when the user, still carrying the necessary badge, which has also been identified by the vehicle, wishes to unlock his vehicle, he closes the door of his vehicle and approaches or momentarily presses on another specific part of the handle, referred to as the "locking zone". This gesture makes it possible to automatically lock the openings of the vehicle.

These presence detection devices generally comprise two capacitive sensors, in the form of two electrodes electrically connected to a printed circuit board, integrated in the door handle, in each case in a specific locking or unlocking zone. Generally, one electrode is dedicated to each zone, that is to say one electrode is dedicated to the detection of the approach and/or of the contact of the hand of the user in the locking zone and one electrode is dedicated to the detection of the approach and/or of the contact of the hand of the user in the unlocking zone.

The presence detection device further comprises a radio frequency antenna, generally LF (low frequency). The detection device is connected to the electronic control unit (ECU) of the vehicle and sends a presence detection signal to said unit. The electronic control unit of the vehicle has identified the user beforehand as being authorized to access this vehicle, or alternatively proceeds with this identification following the receipt of this presence detection signal. To this end, it sends an identification request by means of the radio frequency antenna to the badge (or to the remote control) carried by the user. In response, this badge sends its identification code via RF (radio frequency) waves to the electronic control unit of the vehicle. If the electronic control unit recognizes the identification code as that authorizing access to the vehicle, it triggers the locking/unlocking of the door (or of all the openings). If, by contrast, the electronic control unit has not received an identification code or if the received identification code is incorrect, the locking or unlocking is not performed.

Such vehicles are thus equipped with door handles comprising a detection device itself comprising a radio frequency antenna, generally low frequency, or at least one electrode connected to a printed circuit board.

Merely by way of explanation, a detection device D comprising just a single electrode, the electrode being dedicated for example to the unlocking zone connected to a printed circuit board, and an LF antenna will be considered here. A detection device D of the prior art is described with reference to FIGS. 1 and 2.

FIG. 1 shows a motor vehicle door handle 10 (vehicle not shown), in which a device D for detecting the presence of a user is located. Said door handle 10 comprises a first outer surface S1 oriented in the direction of the door P and a second outer surface S2 opposite the first outer surface S1 and therefore oriented on the side opposite the vehicle, more specifically toward the user (not shown). This detection device D comprises an electrode 12 (unlocking electrode), of which a face is located in the proximity of the first outer surface S1, and control means 13 and an LF antenna 11, of which a face is located in the proximity of the second outer surface S2. The electrode 12 is connected to the control means 13. These control means 13 measure the capacitance at the terminals of the electrode 12 so as to detect the presence of a user and are formed for example by a printed circuit board comprising a microcontroller (not shown). The LF antenna 11 is connected for its part to an electronic control unit installed on the vehicle (not shown) of the BCM (body controller module) type, which manages the identification requests emitted by said LF antenna 11.

Figure 2:
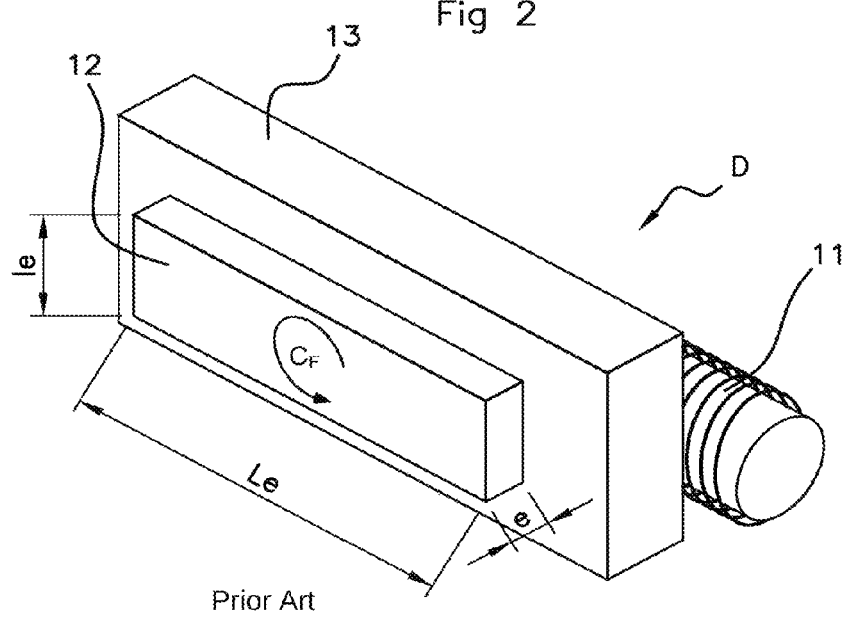

FIG. 2 shows the prior art detection device D in greater detail. The LF antenna 11 is provided in the form of a winding around a ferrite, and the electrode 12 is provided in the form of a metal plate, for example a copper sheet, or in the form of a copper surface printed on the control means 13, that is to say on the printed circuit board.

This detection device D of the prior art has two major disadvantages.

The first disadvantage lies in the proximity between the LF antenna 11 and the electrode 12. This proximity creates eddy currents (shown by the arrow $C_F$) in the electrode 12, which are induced by the activation of the LF antenna 11. These eddy currents in the electrode 12 in turn interfere with the operation of the LF antenna 11 and reduce its emission range whilst increasing the temperature of the electrode 12.

The second disadvantage lies in the form of the electrode 12. Since it is formed by a metal plate or a copper surface printed on a printed circuit board, and since it is supplied with current, the electrode 12 behaves as an RLC circuit, that is to say a circuit having a resistance R, an inductance L, and a capacitance C. The values of the resistance R, of the inductance L and of the capacitance C are dependent on the dimensions of the electrode 12, that is to say the length thereof Le, the width thereof le and the thickness thereof e (see FIG. 2).

Thus, when the electrode 12 (that is to say the RLC circuit) sustains an oscillation, it may start to resonate.

More specifically, the electrode 12 has a characteristic impedance Z, which is minimal for an oscillation frequency value referred to as a resonance frequency Fr and is defined by:

$$Z = \sqrt{\frac{R + jLw}{jCw}}$$

with:

$$w = 2*\pi*F$$

where:
R: resistance of the electrode 12,
L: inductance of the electrode 12,
C: capacitance of the electrode 12,
j: imaginary part of complex numbers,
w: pulse of the oscillation,
F: frequency of the oscillation.

Figure 3:
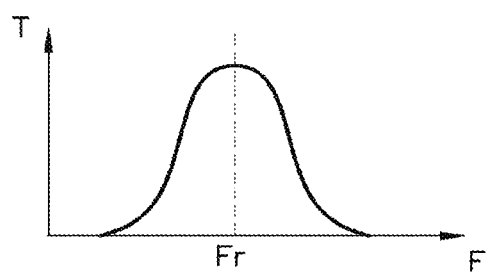

The transmittance T in accordance with the frequency F of the electrode 12 is illustrated schematically in FIG. 3. The transmittance T has its maximum at the resonance frequency Fr.

When the electrode 12 senses an oscillation, that is to say a radio frequency wave at this resonance frequency Fr, originating from electromagnetic interference resulting from the external environment, the device D for detecting the presence of a user no longer functions. More specifically, the presence of a user close to the door handle 10 can no longer be detected or is detected incorrectly, which results in an unnecessary discharge of the battery of the vehicle. In fact, in this latter case, the capacitive sensor is unnecessarily involved during the incorrect detection phases, whereas it could be in standby and could therefore consume less energy.

SUMMARY OF THE INVENTION

The present invention makes it possible to resolve these disadvantages and propose a device for detecting the presence of a user that does not interfere with the functioning of the LF antenna 11 and that is immune to all external electromagnetic interference.

The invention proposes a device for detecting the presence of a user comprising:
an electrode,
electrode control means,
a low frequency antenna.
In accordance with the invention:
the electrode is formed from a plurality of structural units, each structural unit comprising:
a conductive segment defined by dimensions and connected electrically at least to
a conductive connection defined by a position of connection with respect to the conductive segment, and
the structural units being electrically interconnected by the conductive connections,
at least two consecutive structural elements that differ by:
the dimensions of the conductive segment and/or
the position of the conductive connection.

In accordance with the invention, due to the fact that at least two consecutive structural units are not identical, the conductive segments of these two structural units have different resonance frequencies. A wave having a determined frequency therefore cannot propagate freely between these two conductive segments.

This is also the case for all the other conductive segments of the electrode.

The amplitude of the transmittance resulting from the different resonance frequencies of the structural units of the electrode is then substantially zero on the whole. Thus, in accordance with the invention, the electrode as a whole does not resonate, as in the prior art, at a determined resonance frequency Fr resulting from external electromagnetic interference, which would prevent the device for detecting the presence of a user from functioning correctly, that is to say would either prevent the device from detecting the presence of a user or would cause said device to detect the presence of a user incorrectly (the user not being present).

In a particularly advantageous embodiment, all the structural elements differ from one another by:
the dimensions of the conductive segment and/or
the position of the conductive connection.

In one embodiment, the low frequency antenna is defined by a longitudinal axis and by a transverse axis, and at least one conductive segment has a length perpendicular to the longitudinal axis and a width parallel to the longitudinal axis.

Alternatively, all the conductive segments have a length perpendicular to the longitudinal axis and a width parallel to the longitudinal axis and the conductive connections are rectilinear and parallel to the longitudinal axis.

The lengths of all the conductive segments are preferably equal, and the widths of the all the conductive segments are different.

The control means sensibly comprise a printed circuit board and
the electrode consists of a copper imprint on the printed circuit board and
a minimum width of a conductive segment corresponds to a minimum width of the copper imprint.

More specifically, a length of a conductive connection is between 0.1 mm and 0.5 mm.

The invention also relates to a door handle comprising the detection device in accordance with the features described above and to any motor vehicle comprising said door handle.

BRIEF DESCRIPTION OF THE INVENTION

Figure 4:
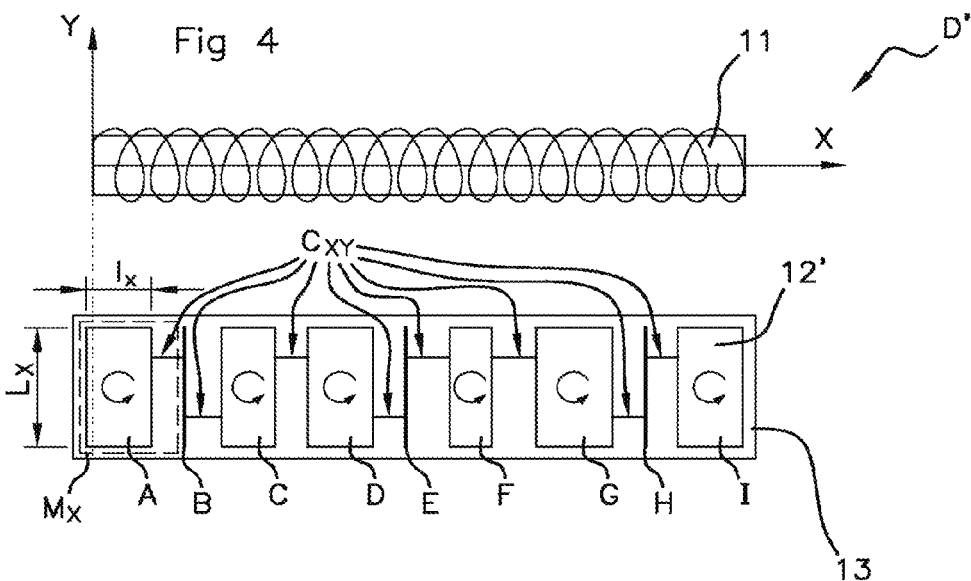
Figure 5:
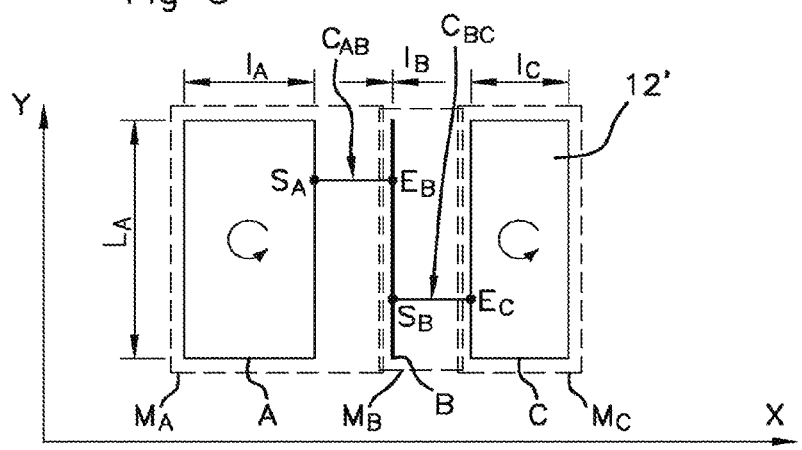
Figure 6:
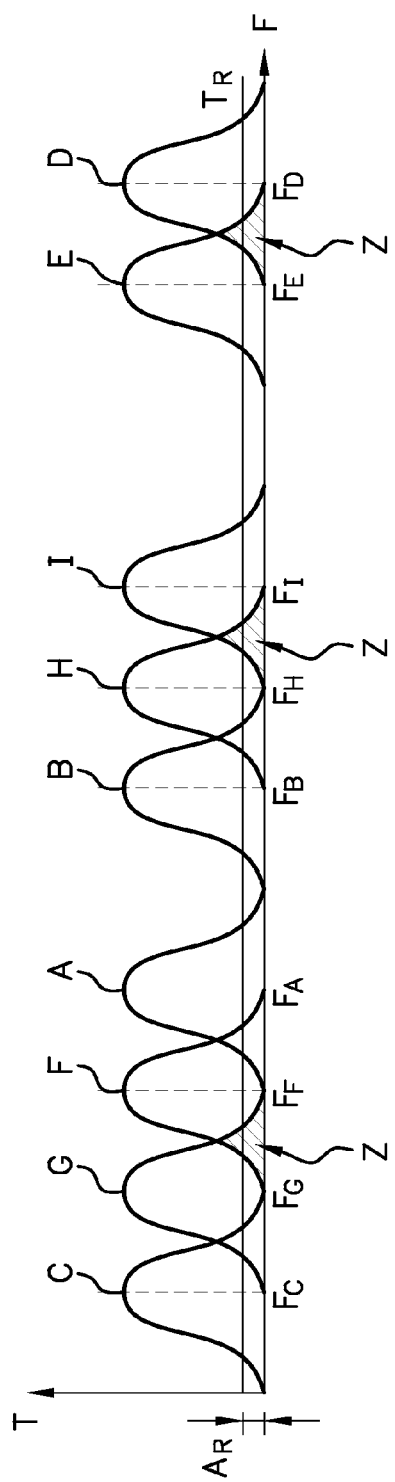
Figure 7:
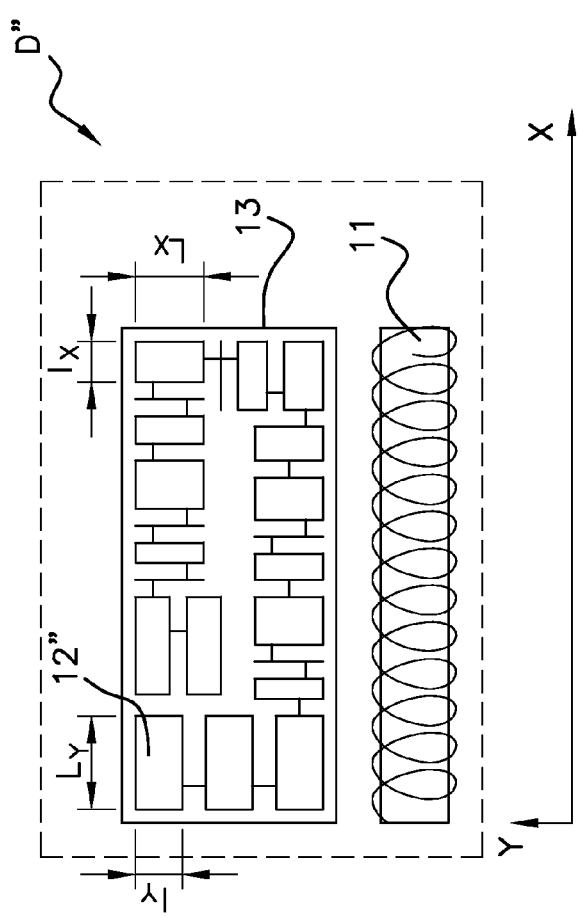
Figure 8:
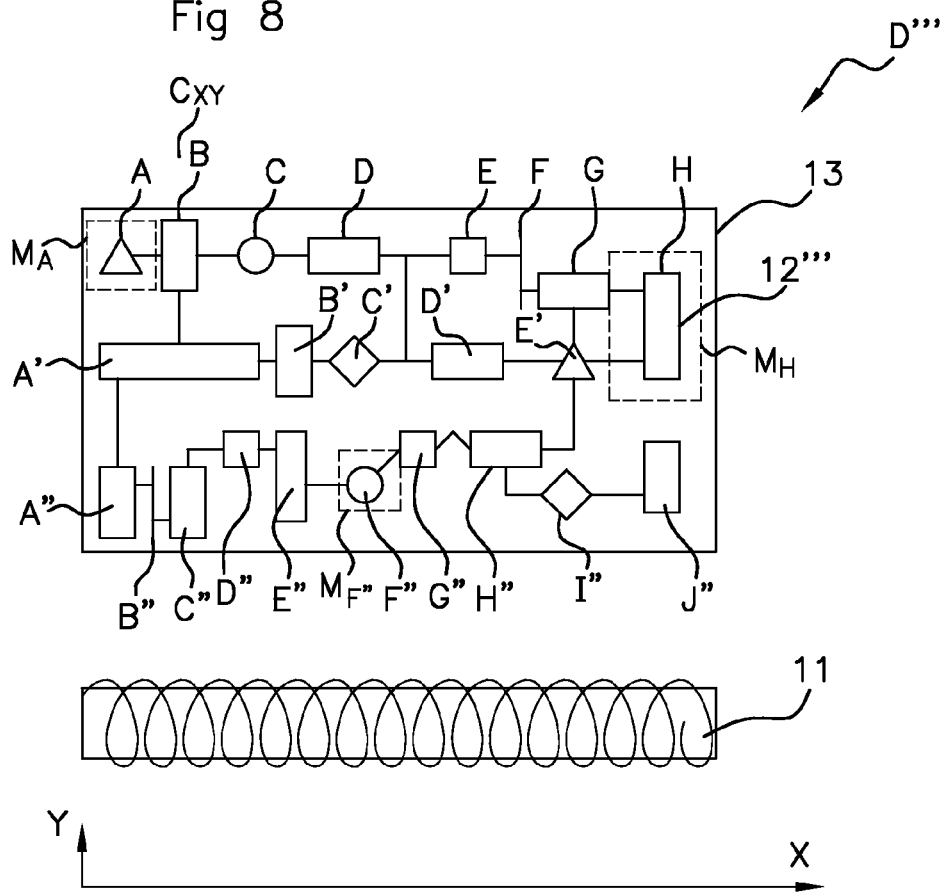
Figure 9:
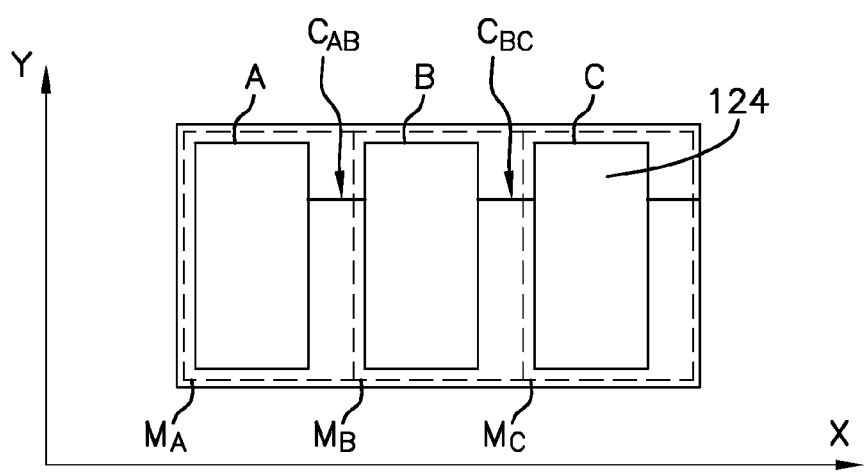

Further objectives, features and advantages of the invention will become clear upon reading the following description provided by way of non-limiting example and upon studying the accompanying drawings, in which:

FIG. 1, which has already been explained, schematically shows a vehicle door handle 10 comprising a prior art device D for detecting the presence of the user, FIG. 2, which has already been explained, schematically shows a prior art device D for detecting the presence of a user, FIG. 3, which has already been explained, schematically illustrates the transmittance T of the frequency F of the electrode 12 according to the prior art, FIG. 4 schematically shows a device D' for detecting the presence of a user according to the invention, FIG. 5 schematically shows three consecutive conductive segments A, B, C of the electrode 12' of the device D' for detecting the presence of a user according to the invention, FIG. 6 schematically illustrates the transmittance T of each conductive segment of the electrode 12' of the device D' for detecting the presence of a user illustrated in FIG. 4 according to the invention, and also the resultant transmittance $T_R$, FIG. 7 schematically shows a first variant of the device D" for detecting the presence of a user according to the invention, FIG. 8 schematically shows a second variant of the device D'" for detecting the presence of a user according to the invention, FIG. 9 schematically shows an electrode that does not correspond to the invention.

DETAILED DESCRIPTION OF THE INVENTION

The invention proposes a device D' for detecting the presence of a user, said device being illustrated in FIG. 4.

The device D' for detecting the presence of a user according to the invention comprises, as in the prior art, an electrode 12', electrode control means 13 (for example a microcontroller comprised in a printed circuit board) and an LF antenna 11.

In a preferred embodiment of the invention, the detection device D' is integrated in a vehicle door handle 10, and the LF antenna 11 is defined by a longitudinal axis X and a transverse axis Y (see FIG. 4).

In accordance with the invention, the electrode 12' is formed by a plurality of structural units $M_X$ (see FIG. 4), each formed by a conductive segment A, B, C, D, E, F, G, H, I electrically connected at least to a conductive connection $C_{XY}$ (X and Y being the indices of the two consecutive segments connected by the conductive connection $C_{XY}$, for example $C_{AB}$ denoting the conductive connection between the segments A and B). The structural units $M_X$ are electrically interconnected by the conductive connections $C_{XY}$.

Each conductive segment A, B, C, D, E, F, G, H, I is defined by dimensions: a length Lx, a width lx and a thickness $e_X$ (X being the index of the conductive segment, for example the segment A has a width $l_A$ and a length $L_A$).

Each conductive connection $C_{XY}$ is defined by a position of connection with respect to the conductive segment A . . . I belonging to the same structural unit $M_X$.

The conductive segments A, B, C, D, E, F, G, H, I and the conductive connections $C_{XY}$ can be cuts made on a copper sheet or imprints of copper on the control means 13. The conductive connections $C_{XY}$ are located at least on one side of the conductive segments A . . . I, either on the side of their length Lx (as illustrated in FIG. 4) or on the side of their length Lx and/or of their width lx as illustrated in FIG. 7.

In accordance with the invention, at least two consecutive structural units A . . . I differ by:
the dimensions (Lx, lx, $e_x$) of the conductive segment A . . . I and/or
the position of the conductive connection $C_{XY}$.

As illustrated in FIG. 4, the widths lx of two consecutive conductive segments A . . . I are different and/or the positions of two consecutive conductive connections $C_{XY}$ with respect to their conductive segment A . . . I (that is to say belonging to the same unit $M_X$) differ. In FIG. 4, two consecutive connections $C_{XY}$ are rectilinear and offset from one another in accordance with the transverse axis Y. This is illustrated in greater detail in FIG. 5. The conductive segments A, B, C each have a different width, respectively $l_A$, $l_B$, $l_C$. In particular, the width $l_B$ of the segment B is minimum and corresponds to the minimum width of a copper imprint on a printed circuit board. The conductive connection $C_{AB}$, connecting the conductive segment A to the conductive segment B, and the conductive connection $C_{BC}$, connecting the conductive segment B to the conductive segment C, are not aligned with one another in accordance with the transverse axis Y, but are offset from one another in accordance with this transverse axis Y. In this example of FIG. 5, the conductive connections $C_{AB}$ and $C_{BC}$ are parallel to the width $l_X$ of the conductive segments A, B, C, but can of course be inclined.

Thus, when the detection device D' of the invention is integrated in a door handle 10 of a vehicle, the electrode 12' formed by the plurality of conductive segments A . . . I of different widths lx does not have a determined resonance frequency Fr, as is the case in the prior art. Each conductive segment A . . . I of the detection device D' of the invention has its own resonance frequency Fx.

FIG. 6 illustrates the transmittance T of the different frequencies F of the different conductive segments A, B, C, D, E, F, G, H, I shown in FIG. 4 as well as their resonance frequency $F_A$, $F_B$, $F_C$, $F_D$, $F_E$, $F_F$, $F_G$, $F_H$, $F_I$.

The conductive segment A has a first resonance frequency $F_A$, of which the value is dependent on the dimensions of the conductive segment A, that is to say on its width $l_A$, its length $L_A$ and its thickness $e_A$ (the thickness being minimal in the case of a copper imprint on a printed circuit board).

Likewise, the conductive segment B has a second resonance frequency $F_B$, of which the value is dependent on the dimensions of the conductive segment B, that is to say on its width $l_B$, its length $L_B$ and its thickness $e_B$.

The conductive segment C has a third resonance frequency $F_C$, of which the value is dependent on the dimensions of the conductive segment C, that is to say on its width $l_C$, its length $L_C$ and its thickness $e_C$.

Since $l_A \neq l_B \neq l_C$ (considering $L_A = L_B = L_C$ and $e_A = e_B = e_C$), this means that $F_A \neq F_B \neq F_C$.

When the first conductive segment A senses an external radio frequency wave at the first resonance frequency $F_A$, this wave cannot propagate in the consecutive conductive segment B since this segment has a second resonance frequency $F_B$ that is different from the first resonance frequency $F_A$. The second conductive segment B thus functions as a filter and prevents the radio frequency wave of first resonance frequency $F_A$ from propagating in all the consecutive conductive segments C, D, E, F, G, H, I, that is to say in the rest of the electrode 12.

This applies to all the conductive segments A . . . I, for example if the third conductive segment C senses a wave having the frequency equal to the third resonance frequency $F_C$, this wave cannot propagate either in the second conductive segment B or in the fourth conductive segment D, these two conductive segments having resonance frequencies ($F_B$, $F_D$) different from the third resonance frequency $F_C$.

This is reinforced by the fact that the conductive connections $C_{XY}$ on either side of the first conductive segment A and of the second conductive segment B ($C_{AB}$ and $C_{BC}$ respectively) are offset from one another with respect to the transverse axis Y. The term "offset" means that the positions of two consecutive conductive connections $C_{XY}$ with respect to the conductive segment A . . . I belonging to the same structural unit $M_X$ differ.

In fact, the value of the resonance frequency of a conductive segment A . . . I does not depend solely on the dimensions of said conductive segment, but also on the path of propagation of the wave through said conductive segment, that is to say from the point of entry and from the point of exit of the wave into/from the conductive segment A . . . I. The point of entry is given by the position of the conductive connection connecting said conductive segment to the previous conductive segment, that is to say the conductive connection $C_{XY}$ belonging to the previous structural unit $M_{X-1}$, and the point of exit is given by the position of the conductive connection connecting said conductive segment to the next conductive segment, that is to say the conductive connection $C_{XY}$ belonging to the structural unit $M_X$.

This is illustrated in FIG. 5. The connection $C_{AB}$ has an exit point $S_A$ from the conductive segment A and has the entry point $E_B$ to the conductive segment B, then the connection $C_{BC}$ has the exit point $S_B$ from the conductive segment B and the entry point $E_C$ to the conductive segment C.

The structural unit $M_A$ comprises the conductive segment A and the conductive connection $C_{AB}$. The structural unit $M_B$ comprises the conductive segment B and the conductive connection $C_{BC}$. These two structural units $M_A$ and $M_B$ differ in particular by the position of the conductive connections $C_{AB}$ and $C_{BC}$, and also by their dimensions. More particularly, the conductive connections are parallel to the longitudinal axis X and the exit points $S_A$ and $S_B$ do not have the same coordinate on the axis Y.

Since the conductive connections $C_{XY}$ are offset relative to one another with respect to the transverse axis Y (the entry point and the exit point of the wave being offset in terms of coordinates along the axis Y), the wave therefore cannot take the quickest path of propagation through the conductive segment A . . . I, that is to say it cannot propagate in a rectilinear manner along the longitudinal axis X through said conductive segment. The path of propagation of the wave through the conductive segment A . . . I is skewed, and the propagation of the wave through said conductive segment A . . . I is thus braked.

Thus, since the resonance frequency of a conductive segment A . . . I is dependent on the path of propagation of the wave through the conductive segment, that is to say on the dimensions of said conductive segment and on the position of the conductive connection $C_{XY}$, the invention lies in the fact that the dimensions (here the widths lx in consideration of the identical lengths Lx and thicknesses $e_x$ for all the segments) of two consecutive conductive segments A . . . I are different, thus preventing the propagation of a radio frequency wave of determined frequency from one conductive segment A . . . I to the next, and/or in the fact that the positions of two consecutive conductive connections $C_{XY}$ connecting these conductive segments differ (here they are offset with respect to one another in accordance with the transverse axis Y), thus disturbing/braking the propagation of the radio frequency wave from one conductive segment A . . . I to the next.

Since each conductive segment A . . . I has its own resonance frequency, which is different from those of the other conductive segments A . . . I, the amplitude $A_R$ of the transmittance $T_R$ resulting from these resonance frequencies of the electrode 12' is then substantially zero on the whole (see FIG. 6). Thus, in accordance with the invention, the electrode 12' as a whole does not resonate, as in the prior art, at a determined resonance frequency resulting from external electromagnetic interference, which would prevent the device D' for detecting the presence of a user from functioning correctly, that is to say would prevent said device from detecting the presence of a user or would cause said device to detect the presence of a user incorrectly (the user not being present).

In the embodiment of FIG. 7, at least one conductive segment A . . . I has its length Lx perpendicular to the longitudinal axis X and its width lx parallel to its longitudinal axis X. In FIG. 4, all the conductive segments A . . . I have their length Lx perpendicular to the longitudinal axis X and their width lx parallel to the longitudinal axis X. The conductive connections Cx are as short as possible and are parallel to the longitudinal axis X.

This arrangement of the conductive segments A . . . I illustrated in FIG. 4 makes it possible to increase the number of conductive segments in the longitudinal direction X in the space allocated to the electrode 12'. This increases to the maximum the copper surface of the electrode 12' so as to improve the detection sensitivity of said electrode 12'.

In addition, the succession of the plurality of conductive segments A . . . 1 minimizes the circulation of eddy currents within the electrode 12'.

In fact, the eddy currents induce a loss of magnetic field of the LF antenna 11 proportional to the surface of the conductor in which said currents propagate. By minimizing the surface of each conductive segment A . . . I (by increasing the number of conductive segments), the impact of eddy currents on the LF antenna 11 is reduced.

Since the circulation of eddy currents is reduced, the functioning of the LF antenna 11 is no longer disturbed, its emission range is no longer reduced, and the temperature of the electrode 12' is not affected, as was the case in the prior art.

In accordance with the invention, the device D' for detecting the presence of a user no longer interferes with the functioning of the LF antenna 11 and is insensitive to all external electromagnetic interference.

Of course, as illustrated in FIG. 6, there are zones of overlap Z between the resonance frequencies of two consecutive conductive segments A . . . I. For example, there is a zone of overlap Z between the resonance frequencies of the conductive segments F and G, H and I and D and E (see FIG. 6). In this zone of overlap Z, two consecutive conductive segments (F, G) (H, I) (D, E) have the same resonance frequency ($F_F=F_G$, $F_H=F_I$, $F_D=F_E$). If a radio frequency wave has a resonance frequency in this zone of overlap Z, it thus propagates freely from one conductive segment to the next, that is to say from the conductive segment F to the conductive segment G or from the conductive segment H to the conductive segment I or from the conductive segment D to the conductive segment E.

Thus, to limit the propagation of a radio frequency wave through the different conductive segments A . . . I, it is preferably recommended for at least the widths $l_X$ of all the conductive segments A . . . I to be different (and/or the lengths Lx and/or the thicknesses $e_x$) so as to limit these zones of overlap Z.

When the electrode 12' consists of a copper imprint on the printed circuit board, the minimum width $l_X$ of a conductive segment A . . . I then corresponds to the minimum width of copper imprint on the printed circuit board.

In a variant of the device D' for detecting the presence of a user, illustrated in FIG. 7, the electrode 12" consists of a succession of conductive segments of which some have their length Lx perpendicular to the longitudinal axis X (and their width lx parallel to the longitudinal axis X), and of which others have their length $L_Y$ parallel to the longitudinal axis X (and their width $l_Y$ perpendicular to the longitudinal axis X). In this variant, the conductive connections $C_{XY}$ are located either on the side of the length $L_X$ or on the side of the width $l_X$ of the conductive segments A . . . I.

The shape of the conductive segments A . . . I is not limited to the rectangular shape. As illustrated in FIG. 8, the electrode 12''' is formed by a plurality of conductive segments A . . . J" of varied shapes: in the shape of a diamond, circle, square, etc. In this embodiment, all the structural units differ from one another by:

the dimensions of the conductive segment and/or the position of the conductive connection.

The form of the conductive connections may also differ: they can be rounded, inclined, have different shapes, but must always be continuous and electrically connect a conductive segment A . . . I to another.

FIG. 9 shows an electrode 124 that does not correspond to the invention. In fact, the structural units $M_A$, $M_B$, $M_C$ are identical: the conductive segments A, B, C have identical dimensions, and the connections $C_{AB}$ and $C_{BC}$ are aligned with one another along the longitudinal axis X. In this figure, a wave having the first resonance frequency $F_A$ of the first conductive segment A quickly passes through the conductive segments B and C since these have the same resonance frequency, and the entire surface of the conductive segments A, B and C resonate at the frequency $F_A$. The detection device is then affected and then no longer functions correctly.

It is essential for the implementation of the invention that: at least two consecutive structural units $M_A \ldots M_I$ differ by:
  the dimensions Lx, lx, $e_x$ of the conductive segment A ... I and/or
  the position of the conductive connection $C_{XY}$.

Where possible, the conductive connections are as short as possible so as to increase the detection surface of the electrode 12'. For example, the conductive connections measure between 0.1 mm and 0.5 mm.

Thus, the device D' for detecting the presence of a user according to the invention does not interfere with the functioning of the LF antenna 11 located in close proximity and is immune to all external electromagnetic interference. The presence of a user close to the door handle 10 can therefore be detected constantly without risk of incorrect detections.

The invention claimed is:

1. A device for detecting the presence of a user, comprising:
  an electrode (12');
  electrode control means (13); and
  a low frequency antenna (11) that creates eddy currents in the electrode (12),
  said electrode (12') being formed by a plurality of structural units (MA ... MI), each structural unit (MA ... MI) comprising:
    a conductive segment (A ... I) defined by dimensions (Lx, lx, ex) and electrically connected at least to a conductive connection (CXY) defined by a position of connection with respect to the conductive segment (A ... I),
  the structural units (MA ... MI) being electrically interconnected by the conductive connections (CXY), and
  at least two consecutive structural units (MA ... MI) differ by:
    the dimensions (Lx, lx, ex) of the conductive segment (A ... I) and/or
    the position of the conductive connection (CXY),
  wherein:
  the low frequency antenna (11) is defined by a longitudinal axis (X) and by a transverse axis (Y),
  at least one conductive segment (A ... I) has a length (Lx) perpendicular to the longitudinal axis (X) and a width (lx) parallel to the longitudinal axis (X),
    all the conductive segments (A ... I) have a length (Lx) perpendicular to the longitudinal axis (X) and a width (lx) parallel to the longitudinal axis (X), and
    the conductive connections (CXY) are rectilinear and parallel to the longitudinal axis (X).

2. The device (D') as claimed in claim 1, wherein:
the lengths (Lx) of all the conductive segments are equal, and
the widths (lx) of all the conductive segments (A ... I) are different.

3. The device as claimed in claim 1, wherein:
the control means (13) comprise a printed circuit board,
the electrode (12') consists of a copper imprint on the printed circuit board, and
a minimum width of a conductive segment (A ... I) corresponds to a minimum width of the copper imprint.

4. The device as claimed in claim 2, wherein:
the control means (13) comprise a printed circuit board,
the electrode (12') consists of a copper imprint on the printed circuit board, and
a minimum width of a conductive segment (A ... I) corresponds to a minimum width of the copper imprint.

5. The device as claimed in claim 1, wherein a length of a conductive connection ($C_{XY}$) is between 0.1 mm to 0.5 mm.

6. The device as claimed in claim 2, wherein a length of a conductive connection ($C_{XY}$) is between 0.1 mm to 0.5 mm.

* * * * *